United States Patent [19]
Inuishi et al.

[11] Patent Number: 5,404,017
[45] Date of Patent: Apr. 4, 1995

[54] ION IMPLANTATION APPARATUS

[75] Inventors: Noriyuki Inuishi; Tadashi Kumakiri; Kouichirou Akari; Jun Munemasa, all of Takasago, Japan

[73] Assignee: Kabushiki Kaisha Kobe Seiko Sho, Kobe, Japan

[21] Appl. No.: 84,145

[22] Filed: Jul. 1, 1993

[30] Foreign Application Priority Data

Jul. 6, 1992 [JP] Japan .................. 4-178541

[51] Int. Cl.6 ........................... H01J 37/317
[52] U.S. Cl. ................. 250/492.3; 250/454.11
[58] Field of Search ............ 250/492.3, 454.1

[56] References Cited

U.S. PATENT DOCUMENTS 4,942,304  7/1990  Boston .................. 250/492.3
4,994,164  2/1991  Bernardet et al. .
5,103,766  4/1992  Yoshikawa et al. .

FOREIGN PATENT DOCUMENTS

0492592A1  1/1992  European Pat. Off. .
63-141251  6/1988  Japan .
1-208449   8/1989  Japan .
1-161257  11/1989  Japan .
2-239543   9/1990  Japan .
3-34058    4/1991  Japan .

Primary Examiner—Jack I. Berman
Attorney, Agent, or Firm—Oblon, Spivak, McClelland, Maier & Neustadt

[57] ABSTRACT

An ion implantation apparatus is intended to perform the ion implantation for the desired surface of a target irrespective of the surface geometry thereof, and to simplify the structure. The apparatus includes a vacuum chamber, and a plurality of arc ion sources for emitting ion beams on the surface of the target disposed within the vacuum chamber. A plurality of arc ion source mounting openings are formed on the vacuum chamber. One or more of arc ion sources necessary for emitting ion beams on the desired surface of the target are airtightly mounted on the openings opposed to the above surface.

14 Claims, 4 Drawing Sheets

→ TIME tion apparatus for the surface modification, having a high performance and being suitable for the industrial applications, in Japanese Patent Laid-open No. hei 1-97363 (U.S. Pat. No. 4,994,164). This apparatus comprises a plurality of cathodes and an electrode structure corresponding to the surface geometry of the target. Similarly, Japanese Patent Laid-open No. hei 2-239543 discloses an ion implantation apparatus including arc ion sources having a plurality of cathodes.

ION IMPLANTATION APPARATUS

BACKGROUND OF THE INVENTION

1. Field of the Invention

The present invention relates to an ion implantation apparatus used for surface modification of materials.

2. Description of the Prior Art

Ion implantation apparatuses have been mainly used for doping processes to semiconductors. In recent years, there has been a strong demand of applying the ion implantation technique to surface modification of materials. To meet the demand, various researches and developments have been made.

The ion implantation apparatuses conventionally used for the surface modification are of a type in which only parts of the end stations of the apparatuses used in the field of the semiconductors are improved. They are very low in the processing ability, processing time, productivity and the like, that is, being only in a level of the so-called laboratory apparatus.

Recently, there has been proposed an ion implantation apparatus for the surface modification, having a high performance and being suitable for the industrial applications, in Japanese Patent Laid-open No. hei 1-97363 (U.S. Pat. No. 4,994,164). This apparatus comprises a plurality of cathodes and an electrode structure corresponding to the surface geometry of the target. Similarly, Japanese Patent Laid-open No. hei 2-239543 discloses an ion implantation apparatus including arc ion sources having a plurality of cathodes.

With use of the ion implantation apparatus of a type described above, it is possible to easily perform the surface modification for a target having a large surface. However, the complicated electrode structure thereof brings inconveniences of making it difficult to obtain uniform ion beams and of complicating the structure of the apparatus itself. Further, since an acceleration electrode provided on each arc ion source is applied with a voltage of several tens kV, it is not easy to form the electrode structure in correspondence to the surface geometry of a target in terms of the insulation.

SUMMARY OF THE INVENTION

Accordingly, an object of the present invention is to provide an ion implantation apparatus capable of performing the ion implantation for the desired surface irrespective of the surface geometry of a target, and simplifying its structure.

In one preferred mode of the present invention, there is provided an ion implantation apparatus of emitting ion beams on the surface of a target for the surface modification of the target, comprising: a vacuum chamber; a plurality of arc ion source mounting openings formed on the vacuum chamber; and a plurality of arc ion sources airtightly mounted on a plurality of the openings, respectively for concurrently emitting ion beams on the different portions of the surface of the target disposed within the vacuum chamber.

Preferably, in the above ion implantation apparatus, an electric power is supplied from one plasma power supply to a plurality of the arc ion sources. Preferably, the above apparatus further includes a switching means for distributing a pulse ion generating voltage supplied from the above plasma power supply into each of the arc ion sources.

According to the present invention, since the openings for the arc ion sources for concurrently emitting ion beams on the different portions of the surface of the target disposed within the vacuum chamber are previously provided, it is not required to design each arc ion source in correspondence to the surface geometry of the target. This makes it possible to easily satisfy the electrical and physical conformity between a plasma generating source within each arc ion source and an acceleration electrode for accelerating ions extracted from the plasma. Therefore, it is possible to use general arc ion sources set at the condition most suitable for generation of ion beams, and hence to easily obtain the uniform and stable ion beams.

Also, since a plurality of the openings are formed in the vacuum chamber, it is possible to mount one or more arc ion sources into the openings situated at the positions opposed to the surface of the target to be subjected to the surface modification in correspondence to the surface geometry of the target, and hence to emit ion beams on the desired surface of the target.

Further, according to the present invention, for supplying the ion generating power to each arc ion source, there is provided the switching means for distributing the pulse electric power to each arc ion source. Therefore, it is possible to eliminate the necessity of the ion generating power supply corresponding to each arc ion source, and hence to reduce the installation cost and to achieve the space conservation.

DESCRIPTION OF THE PREFERRED EMBODIMENTS

Hereinafter, embodiments of the present invention will be described with reference to the drawings.

Figure 1:
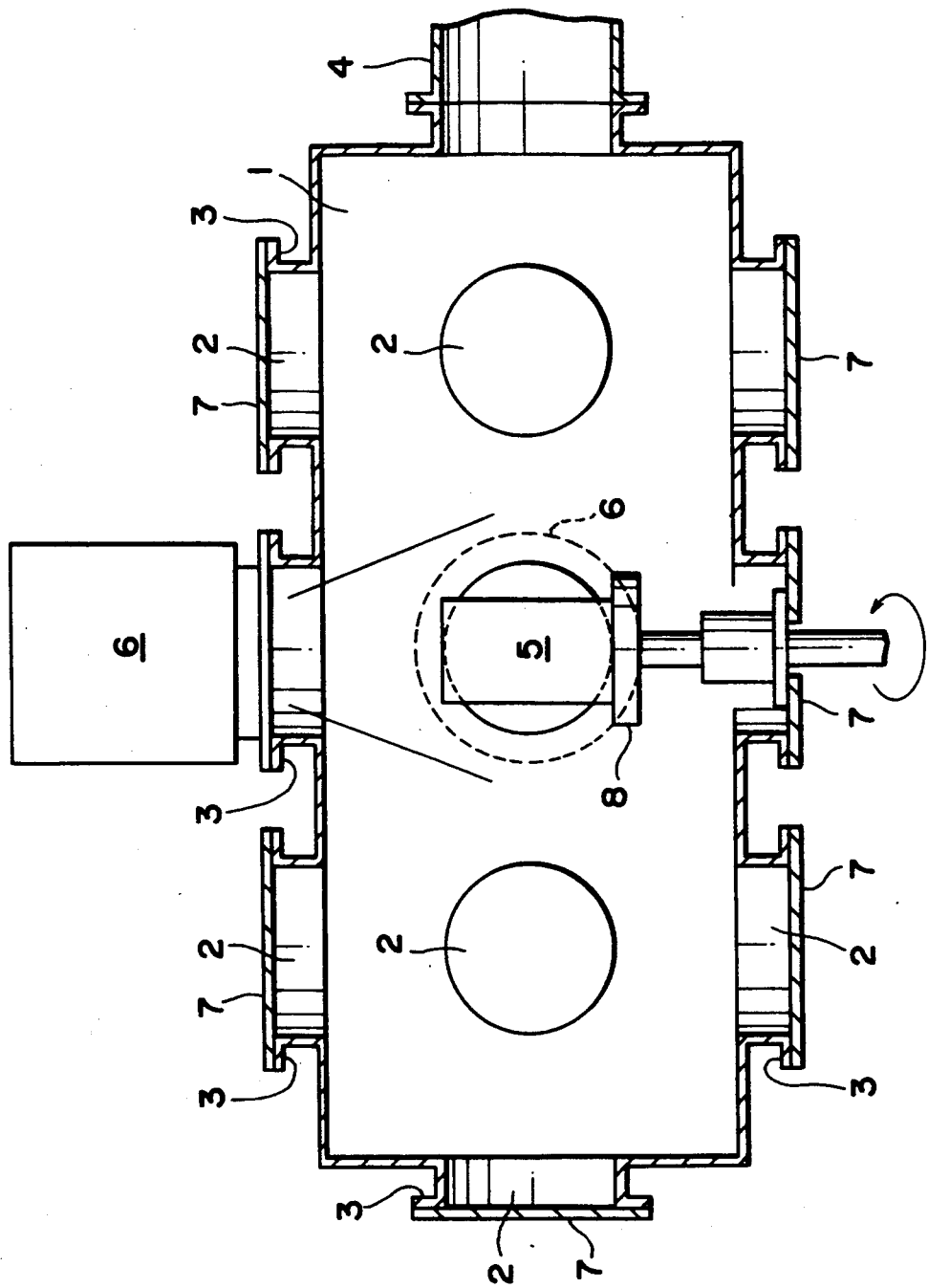
FIG. 1 is a sectional view for explaining an ion implantation apparatus according to the present invention.

FIG. 1 shows an ion implantation apparatus according to one embodiment. In this figure, a plurality of arc ion source mounting openings 2 are formed around the outer peripheral surface of a vacuum chamber 1 of a rectangular parallelopiped shape. A flange 3 is provided on the opening peripheral edge of each opening 2. An evacuation pipe 4 communicated to the interior of the vacuum chamber 1 is provided on one side surface of the vacuum chamber 1, and which is connected to an evacuator (not shown) by means of a piping.

A cylindrical target 5 is rotatably supported within the vacuum chamber 1. On the flange portions 3 provided at the two openings 2, which are positioned on the upper surface and one side surface of the vacuum chamber 1 respectively opposed to the upper surface and one side surface of the target 7, two arc ion sources 6 are airtightly mounted through sealing members. Blind covers 7 are airtightly mounted on the openings 2 other than the above openings 2 mounted with the arc ion sources 6, and which block the openings 2. The rotating shaft of a supporting table 8 for rotatably supporting the target 5 is rotatably and airtightly passed through the blind cover 7 positioned on the lower surface of the vacuum chamber 1.

The arc ion source 6 includes an anode and a cathode for generating plasma of an ion material, and also includes an acceleration electrode for accelerating ions extracted from the plasma and a suppression electrode for suppressing the counterflow of electrons from the acceleration electrode to the plasma generating source. As such an arc ion source 6, there may be used any type being capable of emitting ion beams having a specified expansion, for example, a Kaufman type arc ion source and a Freeman type arc ion source. In the above arc ion source, since the plasma generating source corresponds to the acceleration electrode one by one, it is possible to set the electric and physical condition most suitable for generation of ion beams.

In using the above ion implantation apparatus, a plasma generation electric power (ion generating electric power) is supplied to the two arc ion sources 6 provided at the upper portion and the side portion of the vacuum chamber 1, and ion beams are emitted from the arc ion sources 6 to the outer peripheral surface of the rotating target 5. Thus, the ions are implanted in the surface layer of the target 5, and the surface layer is modified.

The plasma electric power may be supplied to the above two arc ion sources 6 by plasma power supplies independently provided for the arc ion sources 6, or may be supplied by one plasma power supply as described later.

Figure 2:
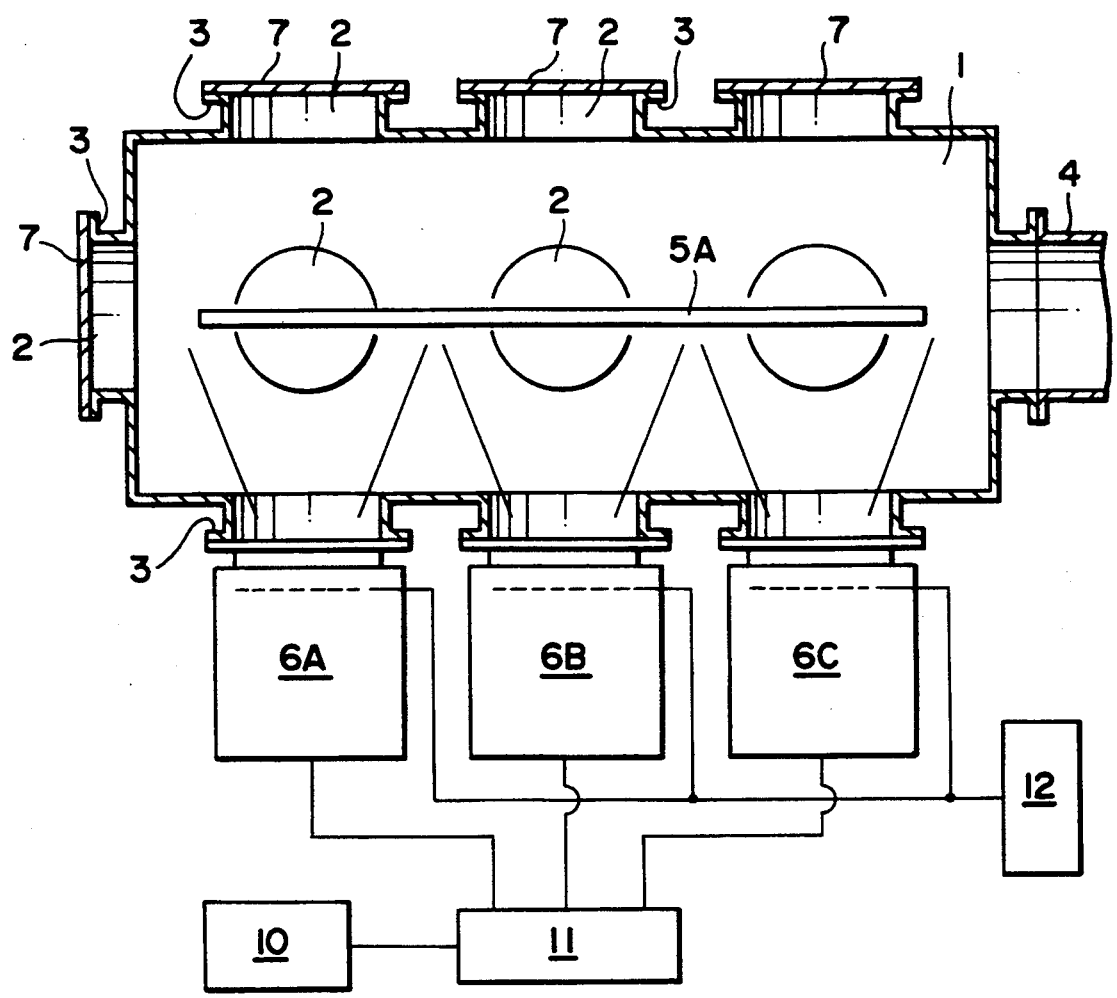
FIG. 2 is a sectional view for explaining an ion implantation apparatus including a switching means.
Figure 3:
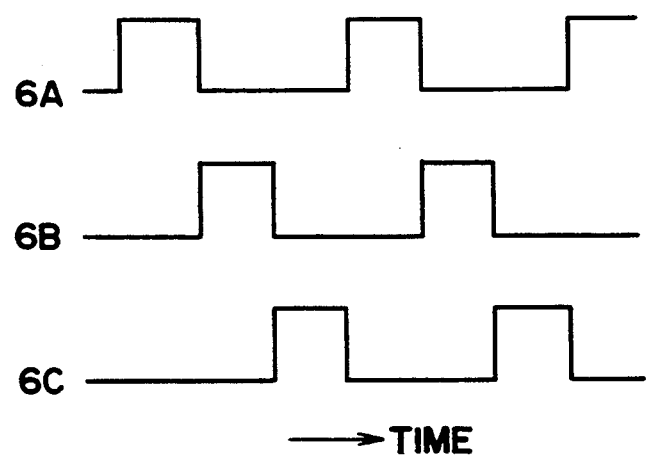
FIG. 3 is a time chart showing an output voltage of the switching means.

FIG. 2 shows the usage of the ion implantation apparatus in the case of processing a plate-like or long sized target 5A. In this case, arc ion sources 6A, 6B and 6C are airtightly mounted at three mounting openings formed on the lower surface of the vacuum chamber 1. Naturally, the ion sources may be mounted on the upper surface as needed. In this embodiment, a plasma generating electric power is supplied from one plasma power supply 10 to the arc ion sources 6A, 6B and 6C through a switching means 11. The switching means 11 is intended to distribute a pulse voltage from the plasma power supply 10 to each of the arc ion sources 6A, 6B and 6C. The pulse voltage is, as shown in FIG. 3, sequentially applied to a plasma generation cathode and anode in each of the arc ion sources 6A, 6B and 6C, and thus each of the arc ion sources 6A, 6B and 6C are actuated according to the applied pulse voltage. On the other hand, since the acceleration electrode of each arc ion source is usually applied with the direct voltage, it is connected to the common acceleration power supply 12. In addition, in this figure, the suppression electrode and the suppression power supply for applying the direct voltage to the suppression electrode are omitted.

Figure 4:
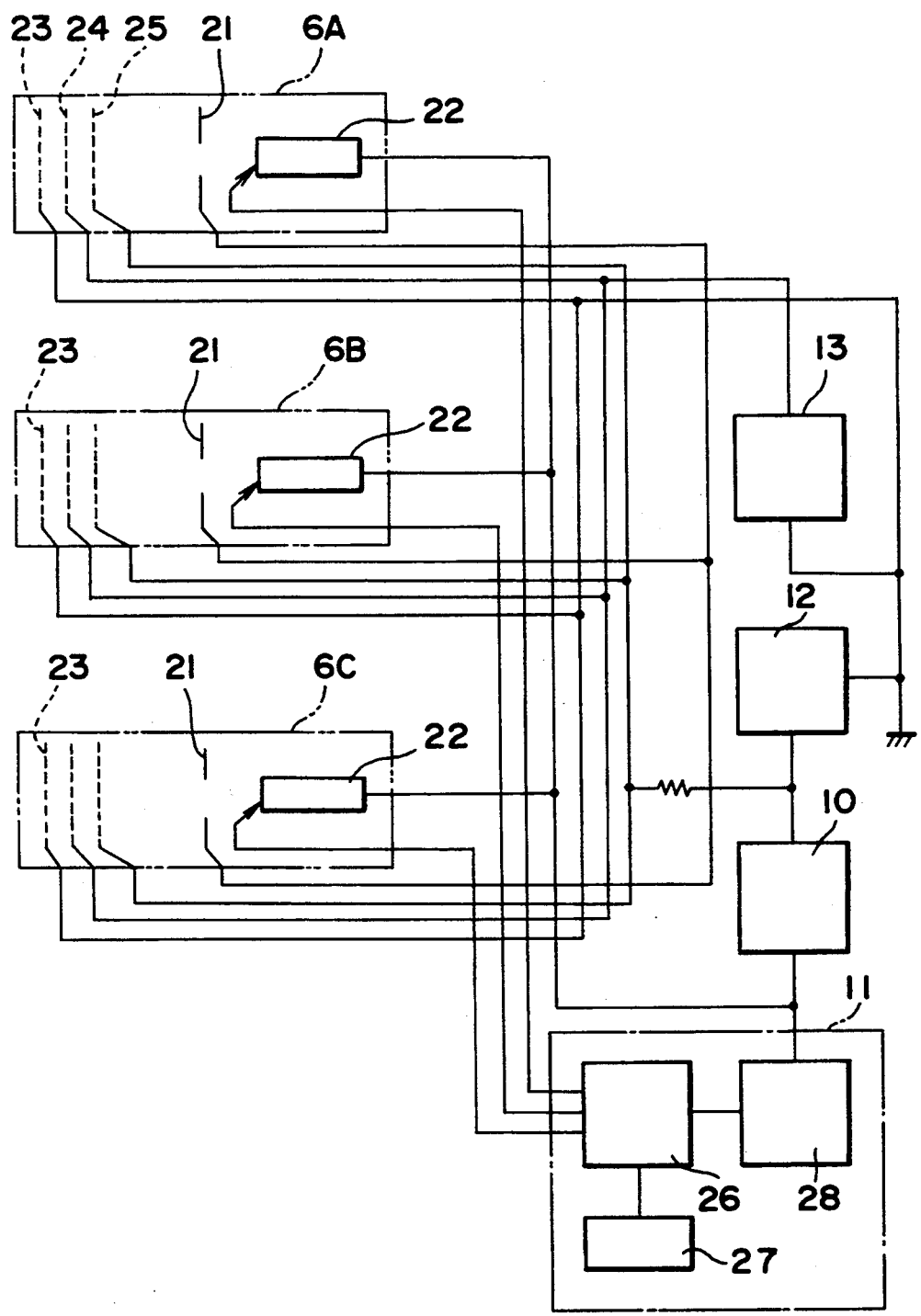
FIG. 4 is a block diagram of an electric circuit for actuating a plurality of arc ion sources with a single plasma power supply.

FIG. 4 is a detailed block diagram of an electric circuit for actuating the three arc ion sources 6A, 6B and 6C. Each arc ion source includes an anode 21 and a cathode (ion seed supply source) 22 for generating plasma, and further, an acceleration electrode 23 and a suppression electrode 24. The above electrodes are respectively connected in parallel to a plasma power supply 10, an acceleration power supply 12 and a suppression power supply 13. Also, the plasma power supply 10 is reduced in voltage through a resistance, and is then connected in parallel to each ion extraction electrode 25. A switching means 11 includes a trigger switching device 26 having a counter timer 27, and a plasma generating trigger power supply 28 started by the signal from the trigger switching device 26. A plasma starting voltage is applied from the plasma generating trigger power supply 28 to the cathode 22 side for generating the starting plasma, so that a plasma for generating ions is generated between the anode 21 and the cathode 22 by the electric power from the plasma power supply 10.

In the above embodiment, for equalizing the applied frequency of the pulse voltage against each of the arc ion sources 6A, 6B and 6C, the switching means 11 is actuated in such a manner that the pulse voltage is sequentially applied to each arc ion source. This is intended to uniformly modify the surface of the target 5A. The actuation of the switching means 11 is not limited to the above-described sequential manner. For example, in the case of promoting the modification at the central portion of the target 5A, the applied frequency of the pulse voltage of the arc ion source 6B may be increased.

Figure 5:
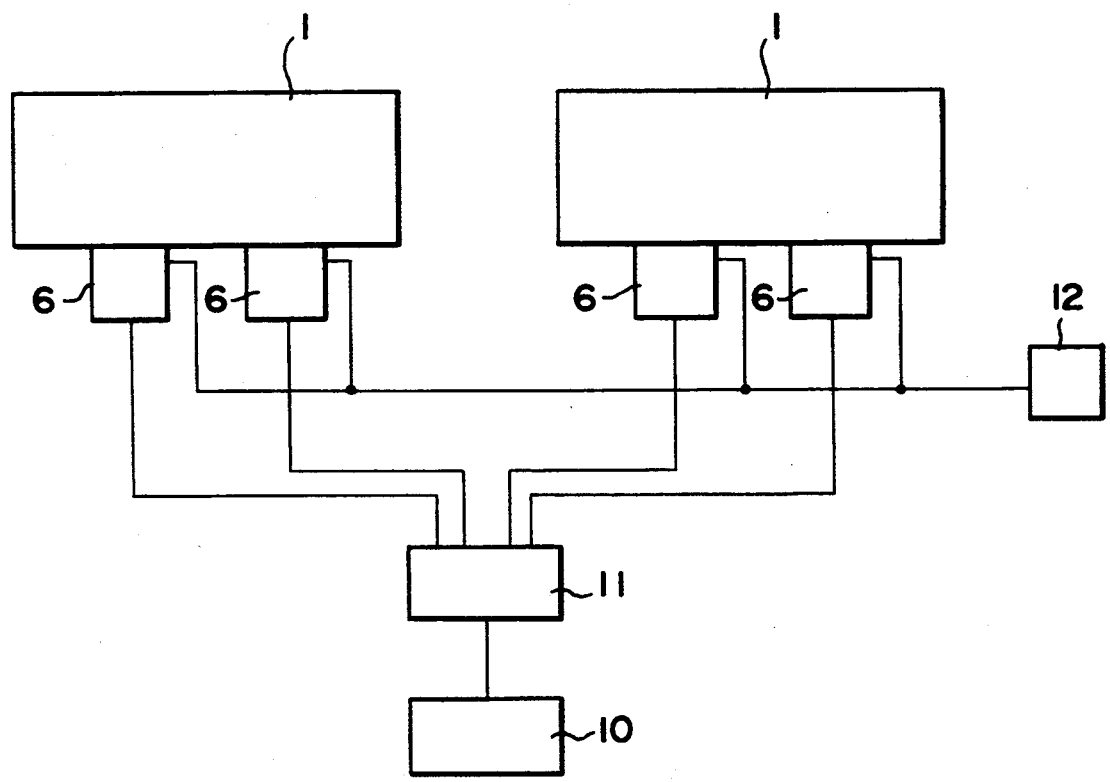
FIG. 5 is a schematic block diagram of an electric circuit for actuating a plurality of arc ion sources respectively provided in a plurality of vacuum chambers with a single plasma power supply.

With use of the above switching means 11, as shown in FIG. 5, even for a plurality of vacuum chambers 1 respectively provided with a plurality of arc ion sources 6, it is possible to supply the plasma generating electric power from a single plasma power supply 10.

Although the vacuum chamber 1 in this embodiment is formed in the rectangular parallelopiped shape, it is not limited thereto, and may be formed in a cylindrical or spherical shape. Also, the number of the mounting openings are not limited, and may be freely selected according to the size of the vacuum chamber. Further, the number of the arc ion sources mounted to a plurality of the mounting openings may be freely selected according to the geometry of the target.

The above embodiment are illustrative and not restrictive, and the present invention may be variously made without departing the spirit and the main feature thereof. The scope of the present invention is defined by the appended claims, and the modification and the changes in the claims fall within the present invention.

We claim:

1. An ion implantation apparatus for emitting ion beams on the surface of a target for surface modification of the target, comprising:
   a vacuum chamber;
   a plurality of arc ion sources mounted on openings formed on said vacuum chamber, said plurality of arc ion sources emitting ion beams to different portions of the surface of the target disposed within the vacuum chamber;
   a single first plasma power supply for supplying an acceleration power to said arc ion sources; and
   a second plasma power supply connected to each of the arc ion sources for supplying a plasma generating power.

2. An ion implantation apparatus according to claim 1, comprising:
   said first plasma power supply connected to an acceleration electrode of each arc ion source; and
   said second plasma power supply connected to a plasma generation cathode and anode of each of said plurality of arc ion sources.

3. An ion implantation apparatus according to claim 1, further comprising:
   a switching means connected between said first plasma power supply and said plurality of arc ion sources, for selectively applying said plasma generation voltage to each of said plurality of arc ion sources.

4. An ion implantation apparatus according to claim 3, wherein said switching means comprises:
- a trigger switching device connected to each of said plurality of arc ion sources;
- a counter timer connected to said trigger switching device; and
- a plasma generating trigger power supply connected to said trigger switching device.

5. An ion implantation apparatus according to claim 3, wherein said switching means comprises:
- a plasma generating trigger power supply generating a plasma starting voltage to generate a starting plasma;
- a trigger switching device connected between a cathode of each of said arc ion sources and said plasma generating power supply to supply said plasma starting voltage to said cathode; and
- a counter timer connected to said trigger switching device.

6. An ion implantation apparatus according to claim 1, wherein said switching means actuates in such a manner that said pulse ion generating voltage is sequentially applied to each of said arc ion sources.

7. An ion implantation apparatus according to claim 1, further comprising:
- blind covers for airtightly blocking said openings which are not mounted with said arc ion sources.

8. An ion implantation apparatus according to claim 1, wherein a supporting base for rotatably supporting said target is mounted on one of said openings.

9. An ion implantation apparatus according to claim 8, wherein said arc ion sources are respectively mounted upwardly and sidewardly of a rotating shaft for rotating said target.

10. An ion implantation apparatus according to claim 1, wherein said vacuum chamber is formed to be a rectangular parallelopiped body, and which includes a plurality of openings provided on the surfaces of said rectangular parallelopiped body on the long side in a line.

11. An ion implantation apparatus according to claim 10, wherein said target is formed in a plate shape, and a plurality of said arc ion sources are disposed in a plurality of said openings opposed to said plate surface.

12. An ion implantation apparatus for emitting ion beams on a surface of a target for surface modification of said target, comprising:
- a first vacuum chamber;
- a plurality of arc ion source mounting openings formed on said first vacuum chamber; and
- a plurality of arc ion sources to be airtightly mounted on a plurality of said openings for concurrently emitting ion beams to different portions of the surface of said target disposed within said first vacuum chamber;
- a second vacuum chamber;
- arc ion sources mounted on said second vacuum chamber; and
- one plasma supply for supplying an electric power to said arc ion sources respectively mounted in said first and second vacuum chambers.

13. An ion implantation apparatus comprising:
- a vacuum chamber kept at vacuum therein;
- arc ion sources for emitting ion beams on the surface of a target disposed within said vacuum chamber, and which are airtightly mounted to arc ion source mounting openings formed on said vacuum chamber,
- wherein a plurality of openings are formed on said vacuum chamber, and one or more of arc ion sources necessary for emitting ion beams on the desired surface of said target are mounted on said openings opposed to said surface of said target;
- a first plasma power supply for supplying an ion acceleration power to said arc ion sources; and
- a second plasma power supply connected to said arc ion sources for supplying a plasma generation power.

14. An ion implantation apparatus according to claim 13, further comprising a switching means for distributing a pulse ion generating electric power into each of said arc ion sources.

* * * * *